March 31, 1959 R. BRAY 2,880,311

SIGNAL SEEKING RECEIVER

Filed Sept. 29, 1954 2 Sheets-Sheet 1

Inventor:
Ralph Bray
by Howson & Howson
Attys.

March 31, 1959 R. BRAY 2,880,311

SIGNAL SEEKING RECEIVER

Filed Sept. 29, 1954 2 Sheets-Sheet 2

Inventor:
Ralph Bray
by Howson & Howson
Attys.

United States Patent Office 2,880,311
Patented Mar. 31, 1959

2,880,311

SIGNAL SEEKING RECEIVER

Ralph Bray, Philadelphia, Pa., assignor to Philco Corporation, Philadelphia, Pa., a corporation of Pennsylvania Application September 29, 1954, Serial No. 459,043

11 Claims. (Cl. 250—20)

Figure 1:
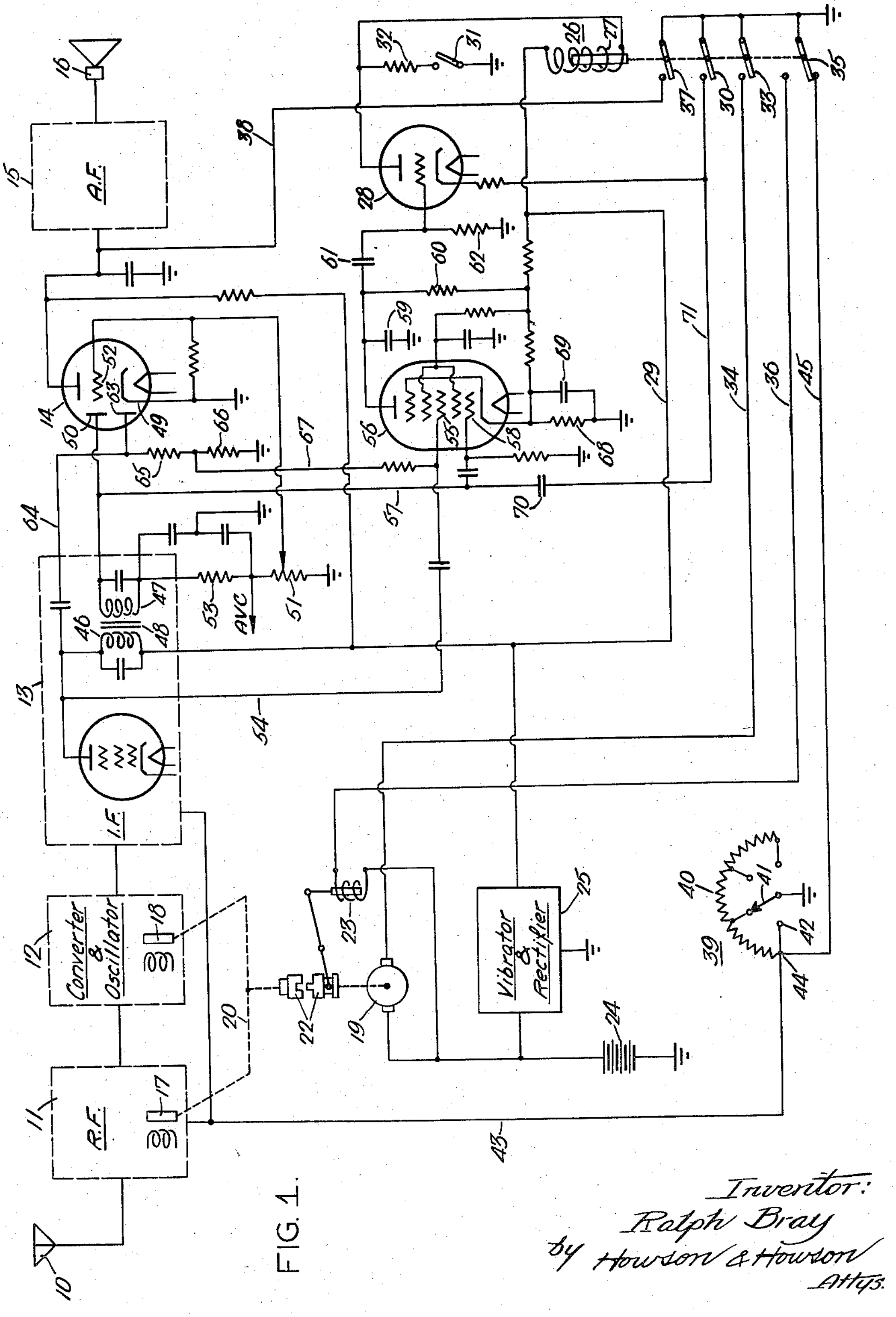

This invention relates to signal receivers of the signal-seeking type which function, in response to a starting operation, to effect automatic tuning over a predetermined range of frequencies. Generally speaking, such a receiver comprises means for effecting automatic tuning in response to a starting operation, and means responsive to incoming signals having frequencies within said predetermined range for stopping the tuning operation when a receivable signal is tuned in. Radio receivers of this type are particularly useful in vehicles, such as automobiles, as they require a minimum amount of attention on the part of the operator. Thus, with such a radio receiver, the operator may simply push a button, and the receiver will then automatically tune itself to the next receivable signal, e.g. the next higher frequency signal, in the reception range or band. If the operator again wishes to change the tuning, he again pushes the starting button and the receiver proceeds to tune itself to the next receivable signal.

Accuracy of tuning is, of course, of utmost importance in any signal-seeking receiver. One problem encountered in such receivers is the tendency to tune beyond, or overrun, the desired frequency due to the inertia of the mechanical elements of the tuning system. Thus, there is a time delay between the response to the received signal and the actual stopping of the tuning operation, which results in overrunning of the tuning with respect to the precise tuning point. It has been proposed heretofore to overcome this objection by causing the signal-responsive means to respond at a frequency in advance of the desired frequency, thereby to allow for the above-mentioned time delay in the stopping of the tuning operation. However, this has not provided a satisfactory and complete solution of the problem of overrun for the reason that the extent of the overrun may vary due to variations in the tuning speed. Thus, where an electric motor is used to drive the tuning elements, the motor speed may vary due, for example, to voltage change.

The principal object of the present invention is to provide a signal-seeking receiver wherein accuracy of tuning is achieved and the aforementioned objection is overcome.

A more specific object of the invention is to provide a signal-seeking receiver wherein accurate tuning is achieved despite the occurrence of wide variations in the tuning speed.

Another object of the invention is to provide a simple circuit arrangement which achieves the desired results without adding substantially to the cost of manufacture of the receiver.

In acocrdance with this invention, accurate tuning of a receiver is achieved despite variations in tuning speed by the provision of a system comprising means for varying the tuned frequency of said receiver through a predetermined frequency range, means for stopping said variation in tuned frequency, and means responsive to the speed at which said tuned frequency is varied and to the reception of a signal having a frequency within said frequency range for initiating the operation of said stopping means at a predetermined time prior to the time at which said receiver is tuned to said signal frequency. In the preferred embodiment, as applied to a superheterodyne receiver, two signal voltages are derived from the I.F. section of the receiver which are phase related according to the tuning, and these voltages are supplied to a phase-difference-response means which has a sloping output voltage characteristic over a predetermined range of frequencies in advance of the intermediate frequency. The output voltage of the said means is supplied to a rate-responsive means which produces a control voltage at a point in said frequency range according to the speed of tuning, and the latter voltage is caused to trigger means for initiating stoppage of the tuning operation. By this arrangement, the triggering action is produced at a point in said frequency range ahead of the intermediate frequency according to the tuning speed.

The invention may be fully understood from the following detailed description with reference to the accompanying drawings, wherein Fig. 1 is a diagrammatic illustration of a signal-seeking receiver embodying the present invention; and Figs. 2 to 5 are explanatory and illustrative curves or graphs.

Referring first to Fig. 1, there is shown a superheterodyne radio receiver which may comprise an antenna 10, a conventional R.F. section 11, a conventional converter and oscillator section 12, and I.F. section 13, a detector 14, a conventional A.F. section 15, and a sound reproducer or loud-speaker 16. Tuning of the receiver is preferably effected by movement of adjustable cores according to the well-known permeability tuning method, two of such cores being represented at 17 and 18. A driving motor 19 serves to actuate the cores through a suitable driving mechanism represented by the dashed lines 20. This mechanism may be of any suitable character; for example, it may be a mechanism such as illustrated and described in the copending application of Joseph E. Laschenski, Serial No. 468,008, filed November 10, 1954. In that mechanism a core carriage is motor driven in one direction to tune through the reception band, and when the carriage reaches the end of its travel range, it is quickly returned to its starting position by a return spring. A clutch 22 operable by solenoid 23 is provided to effect coupling of the tuning mechanism 20 with the driving motor 19 whenever signal-seeking tuning is initiated. If desired, provision may be made for manual tuning at the will of the user, as in the mechanism disclosed in the above-mentioned Laschenski application.

While the invention is broadly applicable to signal receivers, it may be assumed that the radio receiver shown in Fig. 1 is to be used on a vehicle, such as an automobile and, therefore, the usual vehicle battery is represented at 24, and the usual vibrator and rectifier unit is represented in block form at 25. It will be understood that the battery 24 and the unit 25 supply the operating voltages to all of the receiver components. For simplicity, the supply connections are shown only for those components which are illustrated in detail, with which the present invention is concerned.

The driving motor 19 and the clutch solenoid 23 are controlled by a relay 26 whose winding 27 has one terminal connected to the anode of a control tube 28 and the other terminal connected to the positive high voltage supply of unit 25 over connection 29. The cathode circuit of tube 28 is normally open at the relay contact 30. Energization of the relay is initiated by a starting switch 31, the lower terminal of which is grounded and the upper terminal of which is conected through a current-limiting resistor 32 to the junction of winding 27 and the anode of tube 28. When switch 31 is momentarily closed, to initiate energization of relay 26, the closure of relay contact 30 renders the tube 28 operative and a heavy cathode-anode current flows through the tube, maintaining the relay energized through its contact 30. The relay, through its contact 33, closes an energizing circuit for the driving motor 19, which circuit extends over connection 34 to the driving motor 19 and thence to the battery 24. Through its contact 35, in the upper position thereof, the relay also closes an energizing circuit for the clutch solenoid 23, which circuit extends over connection 36 to the solenoid 23 and thence to the battery 24. Upon energization of the motor 19 and the clutch solenoid 23, the motor proceeds to actuate the tuning elements 17 and 18 in a direction to tune the receiver to the next receivable signal. As hereinafter more fully described, initiation of stoppage of the tuning operation is effected by applying a negative voltage impulse to the control grid of tube 28. This effects deenergization of the relay 26, thereby deenergizing the motor 19 and the clutch solenoid 23.

It is desirable to mute the receiver during the tuning operation and this is done by relay contact 37 which, during energization of the relay 26, effectively short-circuits the input of the audio frequency section 15 to ground through connection 38.

It is also desirable to provide means by which the sensitivity of the receiver may be reduced during the signal-seeking turning operation. The purpose of this is to insure that the tuning operation will be stopped only in response to a signal of adequate strength for satisfactory operation of the receiver. Therefore, in the illustrated system there is preferably provided a sensitivity control device 39 which may comprise a tapped resistor 40 and an associated multi-position switch having a grounded movable contact 41 and stationary contacts 42. The sensitivity control is effected conveniently through the cathode-to-ground connection for one or more of the high frequency stages of the receiver, and in the illustrated embodiment the connection 43 extends from the cathodes of the tubes in the R.F. and I.F. sections 11 and 13 to the terminal 44 of device 39, and said terminal is connected over connection 45 to the lower stationary contact associated with movable relay contact 35. Normally, with the relay 26 deenergized, the device 39 is ineffective as it is short-circuited by connection 45 and the relay contact 35. However, during signal-seeking tuning when relay 26 is energizing and contact 35 is in its upper position, the short-circuiting connection is opened and the device 39 is rendered effective. Thus, during signal-seeking tuning, the cathode connection 43 is connected to ground through movable contact 41. With this contact in its extreme left-hand position the resistor 40 is effectively excluded and the sensitivity of the receiver is not reduced. However, wtih the contact 41 in any of its other positions, the sensitivity of the receiver is reduced by virtue of the inclusion of at least a part of resistor 40 in the cathode-to-ground circuit. The amount of sensitivity reduction is dependent, of course, upon the position of contact 41 and the consequent amount of resistance included in the cathoed-to-ground circuit.

As previously mentioned, the present invention is principally concerned with the achievement of accurate tuning despite variations in tuning speed which tend to vary the amount of overrun due to inertia of the mechanical elements of the tuning mechanism. The tendency of the signal-seeking tuning to overrun the proper tuning point is due principally to the functional delays in the dropping out of relay 26, in the operation of the solenoid and clutch 22—23 to disconnect the drive motor 19 from the drive mechanism, and in the inertial coasting of the drive mechanism to a full stop. In the illustrated system, accurate tuning requires that full stoppage of tuning shall occur when the I.F. signal is precisely at the intermediate frequency; and in order to effect accurate tuning it is necessary that the relay 26 be deenergized at a frequency in advance of the intermediate frequency to compensate for the above-mentioned relays. In a physical embodiment of the illustrated system, the total functional delay time is about twenty milliseconds. If the tuning speed is such as to require five seconds to sweep through the entire broadcast band, it requires five milliseconds to tune through one kc. With that tuning speed, the triggering of control tube 28 must occur four kc. ahead of the intermediate frequency in order to achieve accurate tuning, as it requires four kc. for the delay time. Suppose now that the tuning rate decreases so that it requires ten milliseconds to tune through one kc. The triggering of the control tube must now occur only two kc. ahead of the intermediate frequency, as it now requires only two kc. for the delay time. The triggering of the control tube according to the tuning speed is accomplished in the manner described below.

In the illustrated receiver the I.F. section 13 is conventional, comprising an I.F. transformer 48 having primary and secondary windings 46 and 47 respectively, each tuned to the intermediate frequency. The I.F. signal is supplied from the secondary 47 to the detector diode comprising cathode 49 and anode 50 of tube 14. The signal is detected in the usual manner, and the audio component is derived from the volume control resistor 51 and is applied to the grid 52 of tube 14. The triode section of tube 14 serves to amplify the signal which is supplied to the audio frequency section 15. In conventional manner, A.V.C. voltage may be derived from the junction of resistors 51 and 53 and may be utilized in the usual way to effect automatic volume control action.

In order to control the signal-seeking operation, two signal voltages are derived respectively from the primary and secondary of I.F. transformer 48, and these signal voltages are utilized to derive the voltage for triggering the control tube 28. One of these signal voltages is derived via connection 54 from the tuned primary winding 46, is supplied to grid 55 of tube 56 which is shown as a pentagrid tube and is utilized as a phase-responsive or detector device. The other signal voltage is derived from the secondary winding 47 by connection 57 and is supplied to grid 58 of tube 56. As hereinafter fully described, tube 56 serves cooperatively wtih circuit elements 59 to 62 to supply a triggering votlage to the grid of tube 28.

The operation of the trigger system, including the phase detector tube 56, will now be described. The operation of the phase detector 56 is based on the fact that at the intermediate frequency the signal voltage derived via connection 54 from the primary of the I.F. transformer 48 has a 90° phase relationship with the signal voltage derived via connection 57 from the secondary of the I.F. transformer. At frequencies slightly below the intermediate frequency, the phase difference of these voltages is greater, while at frequencies slightly above the intermediate frequency the phase difference is less. The grid 58, to which the derived secondary signal voltage is applied, and the associated cathode function as a self-biasing diode and gate for plate current flow. Current flows on positive signal swings but is effectively cut off during negative swings, and due to the self-biasing action the average current flow is substantially unaffected by the signal amplitude. The plate current flow of tube 56 is further controlled by the derived primary signal voltage which is supplied to the grid 55, and in operation the plate current and, hence, the plate voltage, varies according to the phase relationship of the two signal voltages applied to the grids 55 and 58. As hereinafter described, the plate voltage is utilized to derive a triggering pulse for the control tube 28.

It should be noted that overloading of the grid 55 on strong signals is prevented by deriving a negative biasing voltage and applying it to that grid. For this purpose, tube 14 is provided with a second diode anode 63 which is coupled through connection 64 to the primary of transformer 48 and is also connected to resistors 65 and 66, from the junction of which the negative biasing voltage is supplied to grid 55 via connection 67. This biasing voltage serves to bias the grid 55 in accordance with signal strength, and the biasing action also serves to limit strong noise impulses which might tend to develop a triggering pulse, even though such noises have an indeterminate R.F. envelope and have no specific phase relationship to the signal voltages applied to grids 55 and 58.

Figure 2:
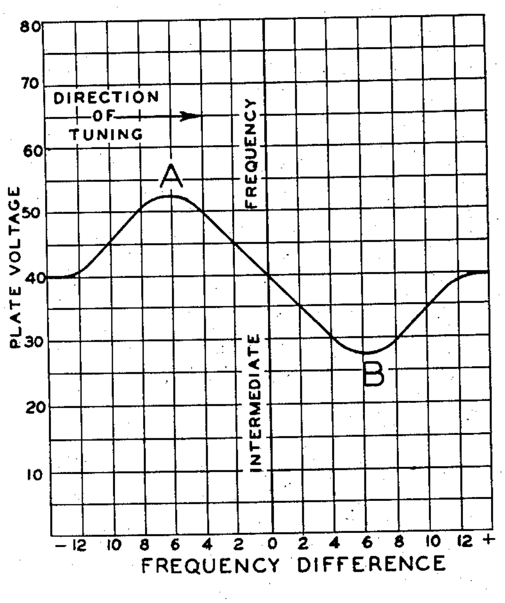

The manner in which the triggering pulse is derived from the varying plate voltage of the phase detector tube 56 may be clearly understood by reference to the explanatory and illustrative curves of Figs. 2 to 5. Fig. 2 shows a typical plate voltage characteristic for a pentagrid tube, e.g., a 6CS6 tube, operating as a conventional mixer-type phase detector. With such a tube employed for the present purpose without modification of its plate voltage characteristic, and with the tube biased for linear operation, the plate voltage curve (when tuning through a signal) would appear as shown in Fig. 2. If it were attempted to use the negative swinging portion between peaks A and B of the curve as the triggering voltage to reduce the plate current of tube 28 and thus effect deenergization of relay 26, the triggering action would not be sufficiently frequency selective, and the tuning action would overrun the intermediate frequency. For example, such operation could result in the triggering action taking place 5 kc. beyond the intermediate frequency, instead of taking place ahead of the intermediate frequency to compensate for the factors previously mentioned.

Figure 3:
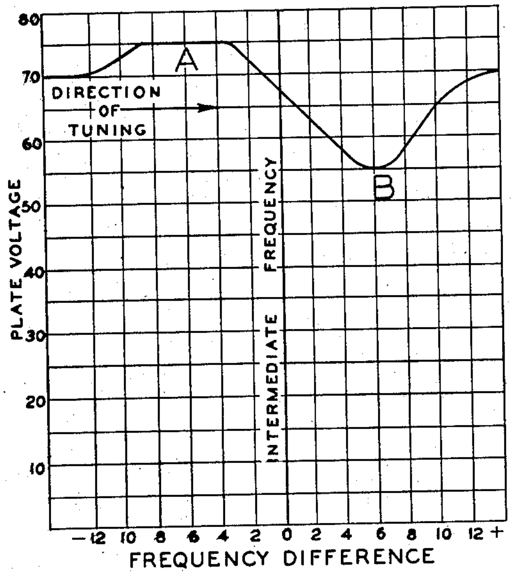

In order to obtain a suitable operating characteristic for the purpose of this invention, certain features now to be described are embodied in the system illustrated in Fig. 1. A biasing network, consisting of a resistor 68 shunted by a condenser 69, is provided in the cathode circuit of tube 56. This establishes a cathode bias for the phase detector tube 56 so that the tube operates near plate current cut-off in the absence of a received signal. This modifies the plate voltage curve, as shown in Fig. 3, where it will be seen that the peak A is effectively flattened due to plate current cut-off produced by the cathode bias. However, the operating characteristic, as depicted by the modified curve, is not yet suitable because the negative swinging portion is substantially the same as in the curve of Fig. 2.

Figure 4:
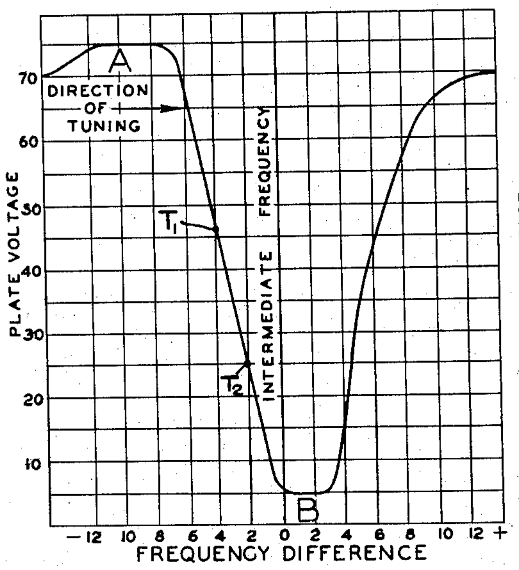

In order to convert the operating characteristic from that of Fig. 3 to that of Fig. 4, a capacitor 70 (Fig. 1) is arranged to be included in the system during signal-seeking operation. It will be noted that this capacitor has one plate connected to the terminal of the secondary 47 of I.F. transformer 48 and has its other plate connected to conductor 71 which is connected to ground through relay contact 30 when the relay 26 is energized. Thus, during signal-seeking tuning, the capacitor 70 is shunted across the secondary of I.F. transformer 48, and it effectively shifts the operating characteristic with respect to the intermediate frequency, so that the negative-going portion is substantially entirely ahead of, and peak B is closer to, the intermediate frequency. The characteristic is further sharpened by operating the tube 56 with low plate voltage so that saturation is quickly reached. As may be seen in Fig. 4, the negative voltage swing between peaks A and B represents a sharp trigger voltage extending over a definite limited frequency range ahead of the intermediate frequency, and this operating characteristic remains essentially the same whether very weak or very strong signals are being received. There is, of course, a threshold limit where the incoming signal is too weak to develop the necessary negative swing to cause triggering of the control tube.

Figure 5:
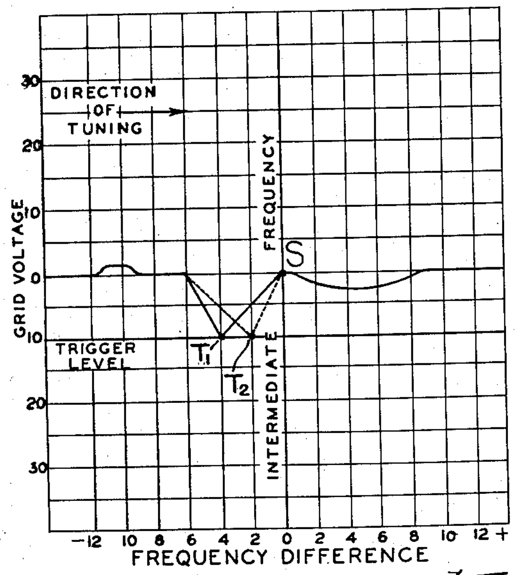

In order to compensate for variations in the tuning speed, the negative-going voltage, represented by the portion of the curve between peaks A and B in Fig. 4 is supplied to a network responsive to its time-rate of change, thereby to produce, at the grid of control tube 28, a triggering impulse having an amplitude proportional to the tuning speed. In the embodiment of Fig. 1, the rate-responsive network is the resistance-capacitance coupling circuit comprising elements 59, 60, 61 and 62. Fig. 5 shows the triggering action for two different tuning speeds. Point $T_1$ (see also Fig. 4) represents the triggering point with a normal rate of tuning, i.e., 5 seconds to tune through the entire broadcast band. Point $T_2$ represents the triggering point when the tuning rate is reduced to one-half of its normal value, i.e., 10 seconds to tune through the entire broadcast band. In the first instance 4 kc. is covered in 20 milliseconds, while in the second instance 2 kc. is covered in 20 milliseconds. Since the functional delays in stopping of the tuning action remain relatively constant at 20 milliseconds after the trigger point is reached, the receiver will be accurately tuned in both instances. In each instance, a negative impulse is produced by differentiation of the negative-going portion of the plate voltage of tube 56, and this impulse is applied to the control grid of tube 28.

It will be understood, of course, that Fig. 5 is intended only to demonstrate, by way of example, the triggering action for each of the tuning speeds above-mentioned. For other tuning speeds the triggering action will vary accordingly. It any case as the tuning action is taking place, the voltage on the grid of tube 28 first rises slightly, as shown by small "hill" in Fig. 5, due to differentiation of the positive-going voltage shown at the left of Fig. 4. This, of course, has no significance or effect because it is in the positive direction and the tube 28 is conducting. Shortly thereafter the triggering action takes place, the voltage on the grid of tube 28 decreasing to the trigger level. After triggering, the grid voltage rises to zero at the restarting point S. When signal-seeking action is again initiated, the grid voltage of tube 28 drops slightly due to the switching in of capacitor 70 and the consequent sudden change in characteristic of the phase detector from that of Fig. 3 to that of Fig. 4. However, the filtering action of capacitor 59 and the positive voltage swing at the plate of tube 56 prevent the voltage on the grid of tube 28 from reaching the trigger level.

From the foregoing description it will be seen that the invention provides a trigger system which effects accurate tuning regardless of changes in tuning speed. It will also be seen that the system is simple and, therefore, does not add substantially to the cost of the receiver. Although it is preferred to employ the pentagrid mixer-type phase detector, any arrangement that gives a suitable operating characteristic may be employed, in a system of the character illustrated and described. For example, a double diode-type phase detector might be used.

In a physical embodiment of the illustrated trigger system employing a 6CS6 tube as the phase detector, the principal circuit elements mentioned above have the following values, it being understood that these are merely exemplary.

| | | |
|---|---|---|
| **59** | microfarads | 0.01 |
| **60** | megohms | 1 |
| **61** | microfarads | 0.047 |
| **62** | megohms | 1 |
| **65** | do | 1 |
| **66** | do | 1 |
| **68** | ohms | 560 |
| **69** | microfarad | 0.047 |
| **70** | micro-microfarads | 15 |

While a single embodiment of the invention has been illustrated and described, it will be understood that the invention is not limited thereto but contemplates such modifications and other embodiments as may occur to those skilled in the art.

I claim:

1. In a signal-seeking receiver, a signal channel, power-operated tuning means, means for initiating operation of said tuning means to effect tuning toward a desired frequency, a grid-controlled tube effective upon application of a triggering voltage to its grid to initiate stoppage of the tuning operation, means for deriving from said signal channel two signal voltages whose phase relation varies according to the tuning of the receiver, means for producing a resultant voltage having a value dependent on the difference in phase between said signal voltages, means responsive to said resultant voltage for producing a triggering voltage in advance of the desired frequency according to the speed of tuning, and means for applying the triggering voltage to the grid of said tube.

2. In a signal-seeking receiver, a signal channel, power-operated tuning means, means for initiating operation of said tuning means to effect tuning toward a desired frequency, a grid-controlled tube effective upon application of a triggering voltage to its grid to initiate stoppage of the tuning operation, there being inherent time delay between initiation of stoppage and full stoppage of the tuning operation, a phase detector including a tube having two control grids and having a plate voltage characteristic determined by the phase relation of signal voltages applied to its control grids, means for deriving from said signal channel and for applying to the control grids of said phase detector tube two signal voltages whose phase relation varies according to the tuning of the receiver, means for differentiating a portion of said plate voltage to produce a triggering voltage in advance of the desired frequency according to the speed of tuning so as to accurately compensate for said time delay, and means for applying the triggering voltage to the grid of the first-mentioned tube.

3. A receiver according to claim 2, including means effective during signal-seeking tuning to modify the plate voltage characteristic of said phase detector tube so as to enhance the production of the triggering voltage.

4. In a signal-seeking superheterodyne receiver wherein a preassigned intermediate frequency represents the point of accurate tuning, power-operated tuning means, means for initiating operation of said tuning means to effect tuning toward said intermediate frequency, a grid-controlled tube effective upon application of a triggering voltage to its grid to initiate stoppage of the tuning operation, there being inherent time delay between initiation of stoppage and full stoppage of the tuning operation, means for deriving from the intermediate frequency section of the receiver two signal voltages whose phase relation varies according to the tuning of the receiver, means for producing a resultant voltage having a value dependent on the difference in phase between said signal voltages, means responsive to said resultant voltage for producing a triggering voltage in advance of the intermediate frequency according to the speed of tuning so as to accurately compensate for said time delay, and means for applying the triggering voltage to the grid of said tube.

5. In a signal-seeking superheterodyne receiver wherein a preassigned intermediate frequency represents the point of accurate tuning, a signal channel including an intermediate frequency transformer having tuned primary and secondary windings, power-operated tuning means, means for initiating operation of said tuning means to effect tuning toward said intermediate frequency, a grid-controlled tube effective upon application of a triggering voltage to its grid to initiate stoppage of the tuning operation, there being inherent time delay between initiation of stoppage and full stoppage of the tuning operation, a phase detector including a tube having two control grids and having a plate voltage characteristic determined by the phase relation of signal voltages applied to its control grids, means for deriving from the primary and secondary windings of said intermediate frequency transformer and for applying to the control grids of said phase detector tube two signal voltages whose phase relation varies according to the tuning of the receiver, means for differentiating a portion of said plate voltage to produce a triggering voltage in advance of said intermediate frequency according to the speed of tuning so as to accurately compensate for said time delay, and means for applying the triggering voltage to the grid of the first-mentioned tube.

6. A receiver according to claim 5, including means effective during signal-seeking tuning to modify the plate voltage characteristic of said phase detector tube so as to enhance the production of the triggering voltage.

7. A receiver according to claim 6, including a capacitor and means for connecting the same in shunt relation to one of said windings during the signal-seeking tuning.

8. In a signal-seeking receiver, power-operated means for tuning said receiver through a predetermined frequency range, actuatable means for stopping the operation of said tuning means, there being inherent time delay between the time of actuation of said stopping means and the time of complete stoppage of tuning, whereby after actuation of said stopping means tuning continues over a span of frequencies determined by the tuning rate which may vary from one tuning operation to another, and means responsive to received signals and to different rates of tuning during successive tuning operations, means for actuating said stopping means at different times in advance of precise tuning according to variations in the tuning rate from one tuning operation to another, so as to effect accurate compensation for the continuation of tuning during each tuning operation and to insure complete stoppage of tuning at the proper frequency.

9. A signal-seeking receiver according to claim 8, wherein the last-recited means comprises means for producing a wave having a sloping characteristic in a range of frequencies in advance of a frequency representing precise tuning, and means responsive to the time rate of change of said wave for actuating said stopping means.

10. A signal-seeking receiver according to claim 8, wherein the last-recited means comprises a tube whose plate voltage varies during tuning of the receiver, and means for differentiating a portion of said plate voltage to produce a triggering voltage for actuating said stopping means.

11. A signal-seeking receiver according to claim 10, including means effective during signal-seeking tuning to modify the plate voltage characteristic of said tube so to enhance the production of the triggering voltage.

References Cited in the file of this patent

UNITED STATES PATENTS

| | | |
|---|---|---|
| 2,207,467 | Muller | July 9, 1940 |
| 2,375,133 | Polkinghorn | May 1, 1945 |
| 2,380,947 | Crosby | Aug. 7, 1945 |
| 2,478,977 | Nicholson | Aug. 16, 1949 |
| 2,506,869 | Gull | May 9, 1950 |
| 2,652,486 | Guyton | Sept. 15, 1953 |
| 2,666,853 | O'Brien | Jan. 19, 1954 |

UNITED STATES PATENT OFFICE

CERTIFICATE OF CORRECTION

Patent No. 2,880,311 March 31, 1959

Ralph Bray

It is hereby certified that error appears in the printed specification of the above numbered patent requiring correction and that the said Letters Patent should read as corrected below.

Column 1, line 63, for "acocrdance" read -- accordance --; column 2, line 28, for "and", second occurrence, read -- an --; column 3, line 27, for "turning" read -- tuning --; line 46, for "energizing" read -- energized --; line 59, for "cathoed-to-ground" read -- cathode-to-ground --; column 4, line 2, for "above-mentioned re-" read -- above-mentioned de- --; line 45, for "wtih" read -- with --; line 46, for "votlage" read -- voltage --; column 6, line 30, for "It" read -- In --; column 8, line 36, after the syllable "tions" strike out ", means".

Signed and sealed this 29th day of September 1959.

(SEAL)
Attest:

KARL H. AXLINE
Attesting Officer

ROBERT C. WATSON
Commissioner of Patents